United States Patent [19]
Tanabe et al.

[11] Patent Number: 5,565,676
[45] Date of Patent: Oct. 15, 1996

[54] METHOD OF DRIVING PHOTOELECTRIC CONVERSION DEVICE

[75] Inventors: Akihito Tanabe; Shigeru Tohyama, both of Tokyo, Japan

[73] Assignee: NEC Corporation, Japan

[21] Appl. No.: 467,305

[22] Filed: Jun. 6, 1995

Related U.S. Application Data

[62] Division of Ser. No. 358,015, Dec. 16, 1994.

[30] Foreign Application Priority Data

Dec. 27, 1993 [JP] Japan .................................. 5-330293

[51] Int. Cl.$^6$ ............................... G01J 5/02; G01J 5/20
[52] U.S. Cl. ............ 250/340; 250/341.1; 250/341.4; 250/338.4; 257/436; 257/447; 257/448; 257/449; 257/451; 257/455; 257/228
[58] Field of Search ................................ 250/340, 341.1, 250/341.4, 338.4; 257/436, 447, 448, 449, 451, 455, 228; 356/432

[56] References Cited

U.S. PATENT DOCUMENTS

| | | | |
|---|---|---|---|
| 5,001,532 | 3/1991 | Petroff ...................................... | 257/436 |
| 5,416,344 | 5/1995 | Ishizuya et al. ......................... | 257/436 |

FOREIGN PATENT DOCUMENTS

| | | | |
|---|---|---|---|
| 2-122578 | 5/1990 | Japan ...................................... | 257/436 |

OTHER PUBLICATIONS

Walter Kosonocky, "Review of Infrared Image Sensors with Schottky–Barrier Detectors," Optoelectronics–Devices and Technologies, vol. 6, No. 2, Dec. 1991, pp. 173–203.

Akihio Tanabe, et al., "Utilizing an Optical Cavity to Increase the Saturation Level in a Schottky–Barrier IR Image Sensor," SPIE, vol. 2020, Apr. 1993, pp. 22–29.

Hammam Elabd, et al., "Theory and Measurements of Photoresponse for Thin Film Pd2Si and PtSi Infrared Schottky–Barrier Detectors with Optical Cavity," RCA Review, vol. 43, Dec. 1982, pp. 569–589.

Walter Kosonocky, "State–of–the–Art in Schottky–Barrier IR Image Sensors," SPIE, vol. 1685, Jun. 1992, pp. 2–19.

*Primary Examiner*—Jerome Jackson, Jr.
*Assistant Examiner*—John Guay
*Attorney, Agent, or Firm*—Hayes, Soloway, Hennessey, Grossman & Hage, P.C.

[57] ABSTRACT

Disclosed is a photoelectric conversion device in which a photodiode capacitance is increased. A transparent electrode is formed between a reflecting plate and a photodiode constituting a unitary picture element of a CCD image sensor. It is so formed that light is incident from the rear surface and the loop of the standing wave of the light comes on a platinum silicide film, thereby achieving the effective absorption of the incident light. The transparent electrode is formed between the reflecting plate and the photodiode in opposition to the platinum silicide film. The capacitance between the transparent electrode and the platinum silicide film can be utilized as photodiode capacitance. Optically optimum thickness is assured by individually forming the reflecting plate which optimizes optical properties represented by the absorption of the incident light, and the transparent electrode used for increasing the photodiode capacitance, and also applying a pulse voltage to the transparent electrode at a given timing in such a manner that the potential at the time of resetting of the photodiode potential is lower than that obtained when the charge is accumulated.

2 Claims, 3 Drawing Sheets

INCIDENT LIGHT

INCIDENT LIGHT

METHOD OF DRIVING PHOTOELECTRIC CONVERSION DEVICE

This is a divisional of copending application Ser. No. 8/358,015, filed on Dec. 16, 1994.

BACKGROUND OF THE INVENTION

1. Field of the Invention

The present invention relates to a back-illuminated type photoelectric conversion device and a method of driving the same.

2. Description of the Prior Art

A conventional photoelectric conversion device and a driving method thereof will herein be explained by way of example. FIG. 1(a) is a sectional view of a unitary picture element for a CCD image sensor in which the conventional back-illuminated type photoelectric conversion devices are arranged in two-dimensional configuration. In this example, an infrared sensor made of a platinum silicide/silicon Schottky diode is used as a photodiode. The photodiode is formed by bringing platinum silicide film 1 into Schottky contact with P-type silicon substrate 2 and n guard ring 3 including $n^+$ region 4 is formed on the periphery thereof for suppressing leak currents. The electric charge accumulated in the photodiode is transferred through a CCD adjacent thereto and outputted to the outside. The CCD is composed of n well 6, transfer electrode 10 and transfer gate electrode 9.

FIG. 1(b) illustrates a driving waveform applied to transfer gate electrode 9 for reading out the charge. A potential of high level during a time interval of $t_1$–$t_2$ causes transfer gate electrode 9 to be driven into conduction and allows the potential of the photodiode to be reset, thereby concurrently effecting the reading out of the accumulated charge. Thereafter, the charge is further transferred by the CCD, but the explanation on the operation thereof is omitted. The electric charge is again read out at time $t_3$, and a time interval of $t_3$–$t_2$ provides a charge storage time. This reading operation is performed every one field or one frame of a sensor picture plane.

In this case, the infrared ray is incident from the rear surface, so that anti-reflection coating 12 for reducing reflection is formed on the rear surface in order to make the absorption of light by the photodiode maximum. Reflecting plate 7 is formed toward platinum silicide film 1 being separated by insulating film 8 in such a manner that the loop of the standing wave of the light may come on platinum silicide film 1. Ordinarily, this type of reflecting plate is made of a metal such as aluminum or the like. This sensor is generally used for detecting infrared rays having a wavelength of 3–5 μm, so that the distance between the platinum silicide and the reflecting plate is so adjusted that the absorption peak occurs for a wavelength of about 4 μm. Theoretically, this optical distance is defined by an expression of (2n+1)/4 wavelength (where, n is any integer above zero), and generally chosen to be approximately ¼ wavelength in order to make the light absorption at the insulating film minimum. More concretely, as shown in the proceeding of SPIE, VOL. 1685, pages 2 through 19, the thickness of the insulating film is 7500 Ångström (hereinafter referred to as Å)in the case of $SiO_2$, and 5600 Å in the case of SiO. The difference of the thickness between these two insulating films is due to the difference in the index of refraction. Like these, the optimum value of the distance between the platinum silicide and the reflecting plate can be determined based on the selection of insulating film. In this case, the layer between the platinum silicide and the reflecting plate serves as part of the photodiode capacitance.

FIG. 4 is a diagram showing the photodiode capacitance as a function of photodiode reset voltage, where the capacitance is represented by the number of electrons which can be read into the CCD when the distance between the platinum silicide and the reflecting plate is varied under the condition that the reflecting plate is grounded or not grounded. The insulating film used in this case is $SiO_2$. It can be understood from the comparison between the results obtained when the thickness of the oxide film is close to the optimum value, 8000 Å (represented by square symbols), and the results (a curve represented by X symbols in the lowermost part) obtained when the reflecting plate is not grounded, that the capacitance between the platinum silicide and the reflecting plate corresponds to a large component accounting for approximately half the photodiode capacitance. Since the background component resulting from a radiant light of 300° K. or the like is large in the infrared sensor, it is required to increase the photodiode capacitance in order to expand its dynamic range. As described above, since the capacitance between the platinum silicide and the reflecting plate is a major component of the photodiode capacitance, the photodiode capacitance can be effectively increased by rendering the aforesaid capacitance large. However, it is known that there exists an optimum value for the distance between the platinum silicide and the reflecting plate in view of its optical properties, so that it is not possible to decrease the thickness of the insulating film in order to increase the photodiode capacitance. Upon driving of the conventional photoelectric conversion device shown in FIG. 1(a), the grounding of the reflecting plate and the application of pulse voltage are not performed unlike the present invention. When the reflecting plate is not grounded, the capacitance between the platinum silicide and the reflecting plate is not available because the potential in the reflecting plate becomes equal to that of the photodiode.

SUMMARY OF THE INVENTION

It is therefore an object of the present invention to provide a back-illuminated type photoelectric conversion device capable of making the photodiode capacitance large, while accomplishing optimum optical properties for enabling the absorption of incident light maximum, and a method of driving the same.

According to the first present invention, the back-illuminated type photoelectric conversion device comprises a reflecting plate disposed, via an insulating film, in opposition to a photodiode formed on a semiconductor substrate of the photoelectric conversion device for reflecting light incident from the substrate side through the photodiode and the insulating film toward the photodiode side, wherein the reflecting plate is grounded.

In the preferred embodiment of the aforesaid first invention, the optical distance between the photodiode and the reflecting plate is equal to (2n+1)/4 (wherein, n is any integer above zero) of the wavelength of the incident light wavelength.

According to the second present invention, the back-illuminated type photoelectric conversion device comprises a reflecting plate disposed, via an insulating film, in opposition to a photodiode formed on a semiconductor substrate of the photoelectric conversion device for reflecting the light incident from the substrate side through the photodiode and the insulating film toward the photodiode side, and a transparent electrode disposed opposite to the photodiode in between the reflecting plate and the photodiode and also transparent to the incident light, wherein the transparent electrode is grounded.

In the preferred embodiment of the aforesaid second invention, the reflecting plate may be either grounded or not, and the optical distance between the reflecting plate and the photodiode is equal to (2n+1)/4 (wherein, n is any integer above zero) of the incident light wavelength.

According to the driving method for the back-illuminated type photoelectric conversion device corresponding to the first present invention, a pulse voltage is applied, at a given timing, to the reflecting plate in such a manner that the potential of the reflecting plate becomes lower at the time of resetting of photodiode potential than that obtained at a time when the photodiode charge is accumulated, and according to the driving method for the back-illuminated type photoelectric conversion device corresponding to the second present invention, a pulse voltage is applied, at a given timing, to the transparent plate in such a manner that the potential of the transparent plate becomes lower at the time of resetting of photodiode potential than that obtained at a time when the photodiode is discharged.

DETAILED DESCRIPTION OF THE PREFERRED EMBODIMENTS

Herein, will be provided an explanation of preferred embodiments of the present invention, by reference to the drawings attached.

Figure 1A:
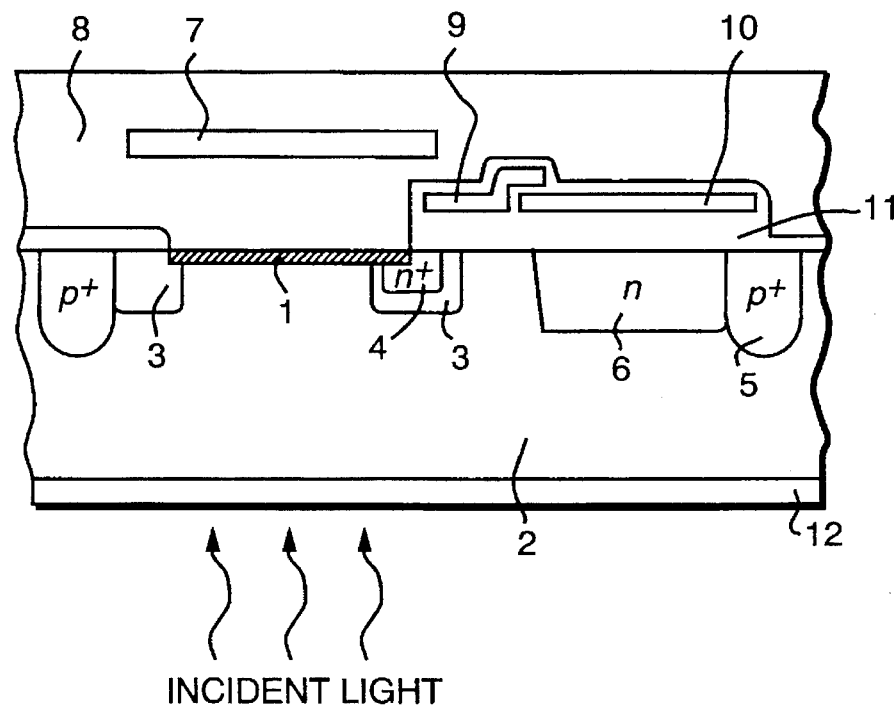
FIG. 1(a) is a sectional view of a unitary picture element in a conventional two-dimensional CCD image sensor.

The first embodiment of the photoelectric conversion device of the present invention has the same construction as that of the prior art example in FIG. 1(a), except that reflecting plate 7 is grounded. As already explained in connection with FIG. 4, the capacitance of the photodiode in the case where the thickness of the insulating film located between the platinum silicide and the reflecting plate is assumed to be 8000 Å is increased almost double as compared to the capacitance of conventional photodiode in which reflecting plate 7 is not grounded.

Figure 2:
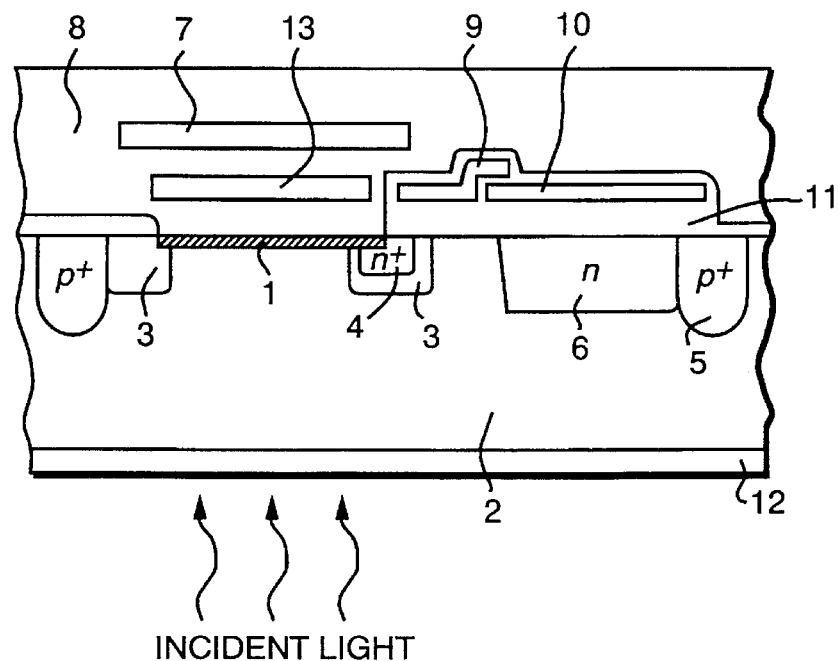
FIG. 2 is a sectional view illustrating the construction of one embodiment of the photoelectric conversion device according to the present invention.

Referring now to FIG. 2 corresponding to the second embodiment of the present invention and illustrating a sectional view of a unitary picture element for reading out the charges accumulated in the photoelectric conversion device by the CCD in the same way as that already mentioned in conjunction with FIG. 1(a), transparent electrode 13 is disposed within the insulating film sandwiched between platinum silicide film 1 and reflecting plate 7, unlike the conventional construction of FIG. 1(a). As transparent electrode 13, a metallic thin film such as the platinum silicide or the like having a thickness of less than 100 Å, a semiconductor with a band gap larger than the energy of the wavelength to be photoelectrically converted, and a conductive metal oxide such as ITO, $SnO_2$, $TiO_2$, etc., can be used. In the case of the infrared photoelectric conversion device aiming a wavelength of 3–5 μm range, its energy is less than 0.4 eV, so that a semiconductor such as polycrystal silicon, amorphous silicon, and ZnSe, etc., having a band gap larger than that range can be used as transparent electrode 13. In this case, transparent electrode 13 has some degree of thickness in view of its resistance value. However, since the optimum optical distance between the platinum silicide and the reflecting plate lies in approximately (2n+1)/4 wavelength (where, n is any integer above zero) as described by referring to the conventional example, the optimum optical properties can be accomplished by adjusting the value of integer n. The reflecting plate can be either grounded or ungrounded. Also, the platinum silicide thin film can be used as transparent electrode since it exhibits a transmittivity of 80% or more for a wavelength of 3–5 μm if the thickness thereof is on the order of 40 Å. In this case, the thickness of the transparent electrode must be thin adequately and a wavelength of about ¼ is used as the optical distance.

Figure 4:
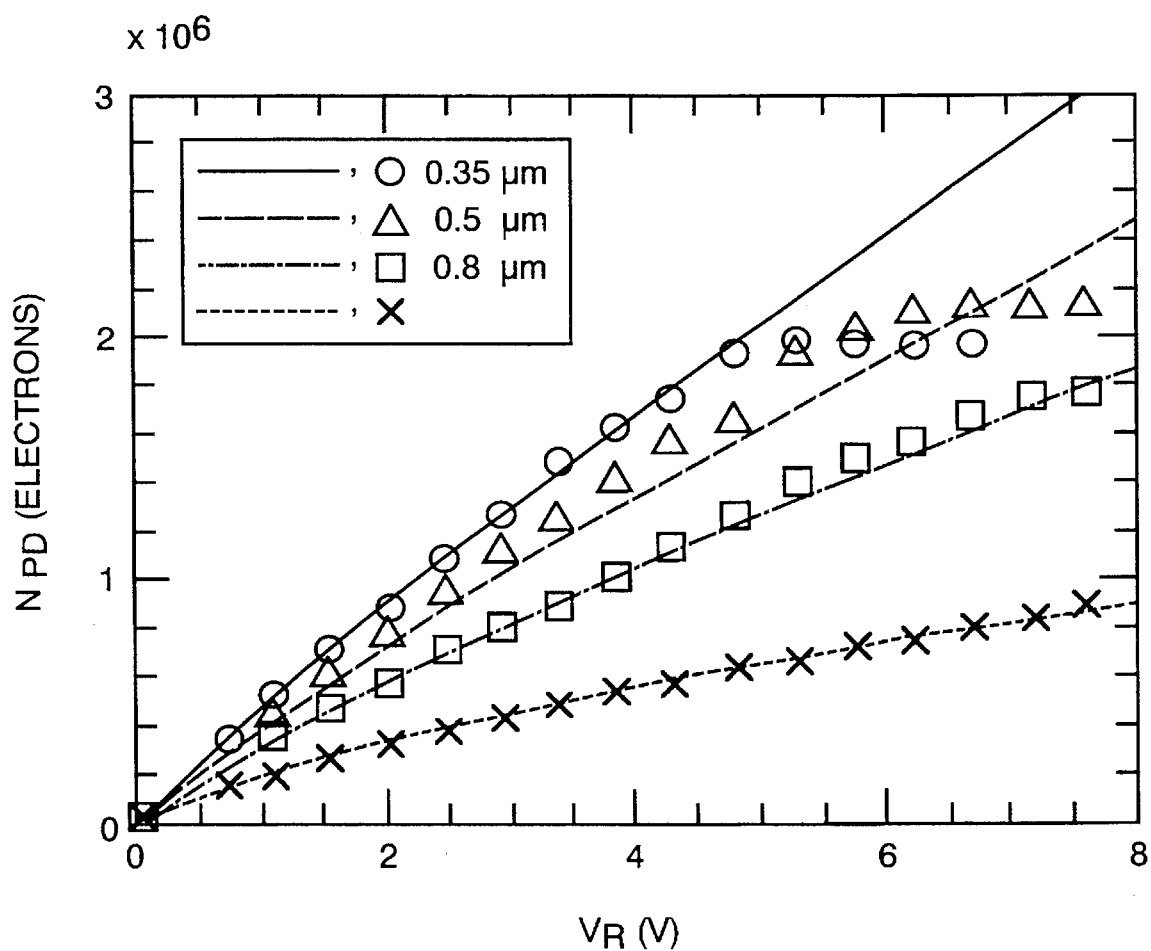
FIG. 4 is a diagram showing photodiode capacitance as a function of photodiode reset voltages, wherein the photodiode capacitance is represented by the number of electrons which are read into a CCD when the distance between the platinum silicide and the reflecting plate is varied under the condition that the reflecting plate is grounded or not.

As the capacitance between the platinum silicide and the transparent electrode is defined by the capacitance of a parallel-plates capacitor with a dielectric between the plates, the smaller the gap between the plates, the larger the capacitance becomes, as can be seen from FIG. 4. As compared with the conventional device of FIG. 1(a), the aforesaid gap is reduced from the gap between the platinum silicide and the reflecting plate to the gap between the platinum silicide and the transparent electrode, so that the photodiode capacitance is increased. In short, according to the photoelectric conversion device of the present invention, an increase in the photodiode capacitance can be realized while accomplishing the optimum optical characteristics making the absorption of incident light maximum.

The foregoing discussion was performed as to the specific case where the CCD was used as a reading circuit. However, because the present invention lies in the improvement of characteristics of the photoelectric conversion unit, it also applicable to any sensor utilizing other reading circuits such as MOS and CSD (Charge Sweep Device) or the like. In addition, it can be applied to either of a single sensor and a one- or two-dimensional array sensor.

Herein, an embodiment of driving method for the photoelectric conversion device of the present invention will be explained in detail. As the photoelectric conversion device in this case, either the structure where only the reflecting plate is provided as in the aforesaid first embodiment or the structure where the transparent electrode is additionally provided as in the aforesaid second embodiment can be applied.

Figure 1B:
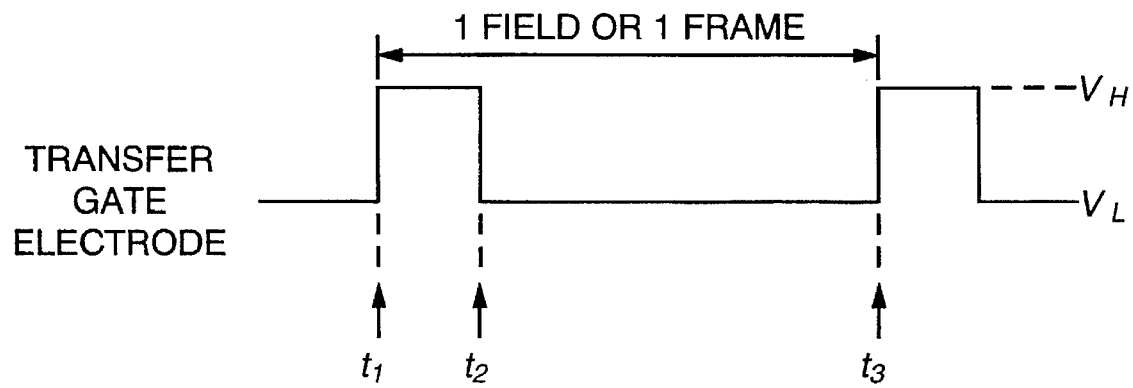
FIG. 1(b) is a timing chart showing a driving voltage waveform applied to a transfer gate electrode upon operation of the element of FIG. 1(a).
Figure 3:
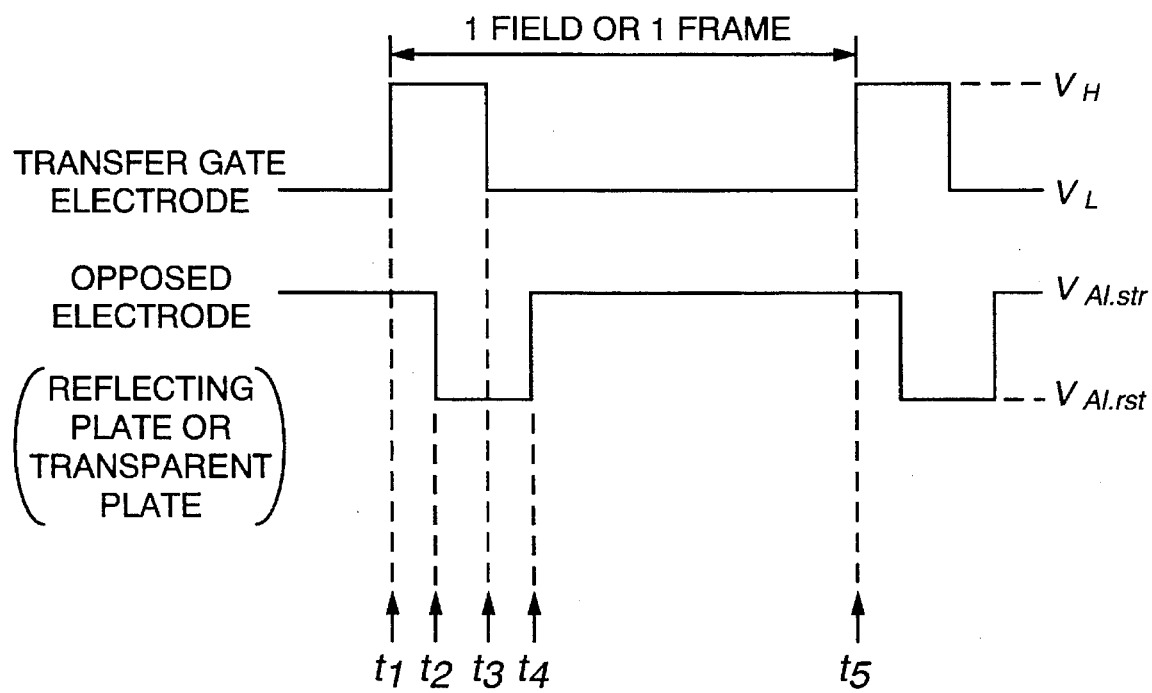
FIG. 3 is a timing chart showing one embodiment of the driving voltage waveform used for driving the photoelectric conversion device according to the present invention.

Referring to FIG. 3 corresponding to one embodiment of the driving method according to the present invention, and illustrating a timing of pulse voltage applied to the electrode (either of the reflecting plate or transparent electrode) located opposite to the transfer gate electrode and the platinum silicide, the pulse voltage is applied to the electrode opposite to the platinum silicide, unlike the conventional example shown in FIG. 1(b). As can be seen from the waveform diagram, a high level of voltage is applied to the transfer gate electrode 9 during a time interval of $t_1$–$t_3$, so that the potential of the photodiode is reset to a reset voltage $V_{rst}$, thereby reading the charge into the CCD. The voltage of the opposed electrode is switched from $V_{A1.str}$ to $V_{A1.rst}$ at the time $T_2$ at which the photodiode is being reset and then returned to $V_{A1.str}$ at the time $t_4$ after the reset period.

After the potential of the photodiode is reset to $V_{rst}$, the charge will be accumulated until the potential becomes 0V since it falls as the accumulation of charge proceeds. Assuming now that the number of electrons accumulated in the photodiode at the potential $V_{PD}$ is N ($V_{PD}$), N ($V_{PD}$=0) cannot be read out, so that the effective amount of charge, $N_{PD}$, read into the CCD will be expressed by the following formula:

$$N_{PD}=N(V_{PD}=V_{rst})-N(V_{PD}=0)$$

Since the number of electrons accumulated within the capacitance between the platinum silicide and its opposed electrode, which is part of $N_{PD}$, is given by $\epsilon_{di}$ ($V_{PD}-V_{A1}$)S/q $d_{di}$, the effective amount of charge, $N_{di}$, obtained in the case where such pulse voltage as shown in FIG. 3 is applied is given by the following formula:

$$N_{di}=\epsilon_{di}(V_{rst}-V_{A1.rst})S/q\ d_{di}-\epsilon_{di}(0-V_{A1.str})\ S/q\ d_{di}=\epsilon_{di}V_{rst}S/q\ d_{di}+\epsilon_{di}(V_{A1.str}-V_{A1.rst})\ S/q\ d_{di}$$

where, $\epsilon_{di}$ and $d_{di}$ show the dielectric strength and the thickness of the insulating body, respectively, $V_{A1}$ is the voltage of the opposed electrode, S shows the area of diode, and q shows an elementary charge. In the event that the potential of the opposed electrode is constant, the second term becomes 0 since $V_{A1.str}=V_{A1.rst}$, whereas, if $V_{A1.str}>V_{A1.rst}$, the photodiode capacitance is increased by the second term.

Although the first and second embodiments have been explained in the case where the transfer gate is controlled by the transfer gate electrode, the present invention is also applicable to the case where transfer electrode 10 is extended up to the region of the transfer gate and a ternary pulse is applied to transfer electrode 10.

As heretofore explained, according to the photoelectric conversion device or the method of driving the same based on the present invention, a remarkable increase in the photodiode capacitance may be attained while accomplishing the optimum optical properties that can make the absorption of incident light maximum.

Although certain preferred embodiments of the present invention have been shown and described in detail, it should be understood that various changes and modifications may be made therein without departing from the scope of the appended claims.

What is claimed is:

1. A method of driving the back-illuminated type photoelectric conversion device of the type comprising a reflecting plate electrode disposed, via an insulating film, in opposition to a photodiode formed on a semiconductor substrate of the photoelectric conversion device for reflecting light incident from the substrate side through said photodiode and said insulating film toward the photodiode side, wherein said reflecting plate electrode is grounded, said method comprising the step of applying a pulse voltage to said reflecting plate electrode at a given timing in such a manner that the potential of said reflecting electrode at the time of resetting of the photodiode potential is lower than that obtained at the time when the photodiode charge is accumulated.

2. A method of driving the back-illuminated type photoelectric conversion device of the type comprising a reflecting plate disposed, via an insulating film, in opposition to a photodiode formed on a semiconductor substrate of the photoelectric conversion device for reflecting light incident from the substrate side through said photodiode and said insulating film toward the photodiode side, and a transparent electrode disposed between said reflecting plate and said photodiode in opposition to said photodiode and transparent to the incident light, wherein said transparent electrode is grounded, said method comprising the step of applying a pulse voltage to said transparent electrode at a given timing in such a manner that the potential of said transparent electrode at the time of resetting of the photodiode potential is lower than that obtained at the time when the photodiode charge is accumulated.

* * * * *